US010515483B2

(12) United States Patent
Dandekar et al.

(10) Patent No.: US 10,515,483 B2
(45) Date of Patent: Dec. 24, 2019

(54) BEAM VISUALIZATION AND USING AUGMENTED REALITY FOR CONTROL AND INTERACTION

(71) Applicant: Drexel University, Philadelphia, PA (US)

(72) Inventors: Kapil R. Dandekar, Philadelphia, PA (US); Cem Sahin, Philadelphia, PA (US); Logan J. Henderson, Philadelphia, PA (US); Danh H. Nguyen, Philadelphia, PA (US); James J. Chacko, Huntingdon Valley, PA (US); Xaime Rivas Rey, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 15/780,391

(22) PCT Filed: Dec. 1, 2016

(86) PCT No.: PCT/US2016/064486
§ 371 (c)(1),
(2) Date: May 31, 2018

(87) PCT Pub. No.: WO2017/096082
PCT Pub. Date: Jun. 8, 2017

(65) Prior Publication Data
US 2018/0350149 A1 Dec. 6, 2018

Related U.S. Application Data

(60) Provisional application No. 62/403,415, filed on Oct. 3, 2016, provisional application No. 62/261,761, filed on Dec. 1, 2015.

(51) Int. Cl.
*G06T 19/00* (2011.01)
*G01R 29/10* (2006.01)
(Continued)

(52) U.S. Cl.
CPC ............ *G06T 19/006* (2013.01); *G01R 29/10* (2013.01); *G06F 3/04847* (2013.01);
(Continued)

(58) Field of Classification Search
None
See application file for complete search history.

(56) References Cited

U.S. PATENT DOCUMENTS

2007/0063911 A1   3/2007  Davidson et al.
2007/0273557 A1  11/2007  Baillot
(Continued)

FOREIGN PATENT DOCUMENTS

WO   2014/121136 A1   8/2014
WO   2017/096082 A1   6/2017

OTHER PUBLICATIONS

International Search Report and Written Opinion for PCT Application No. PCT/US2016/064486 dated Apr. 14, 2017.
(Continued)

*Primary Examiner* — Frank S Chen
(74) *Attorney, Agent, or Firm* — Schott, P.C.

(57) ABSTRACT

Presenting a visualization of antenna radiation patterns may include sending a request to a server for up-to-date information regarding an antenna mode; receiving the request at the server and reading a register value for the antenna mode; responding, by the server, with updated antenna mode information; and overlaying antenna radiation patterns on an image based on the mode information.

19 Claims, 8 Drawing Sheets

(51) Int. Cl.
    *H04B 17/336*   (2015.01)
    *H04B 17/345*   (2015.01)
    *G06F 3/0484*   (2013.01)
    *H04L 12/24*    (2006.01)

(52) U.S. Cl.
    CPC ......... *H04B 17/336* (2015.01); *H04B 17/345* (2015.01); *H04L 41/22* (2013.01)

(56) References Cited

U.S. PATENT DOCUMENTS

| | | |
|---|---|---|
| 2009/0073063 A1 | 3/2009 | Liu et al. |
| 2012/0147040 A1 | 6/2012 | Yun |
| 2012/0147153 A1 | 6/2012 | Lin et al. |
| 2013/0135146 A1* | 5/2013 | Ransom .................. G01S 19/23 342/357.36 |
| 2015/0143478 A1 | 5/2015 | Luckett, Jr. et al. |

OTHER PUBLICATIONS

Nguyen, D.H., et al., "BeamViewer: Visualization of Dynamic Antenna Radiation Patterns using Augmented Reality," IEEE INFOCOM 2016—IEEE Conference on Computer Communications Workshops (INFOCOM WKSHPS), pp. 1-2 (2016).

Nguyen, D.H., et al., "WiART: Visualize and Interact with Wireless Networks using Augmented Reality," Proceeding MobiCom '16 Proceedings of the 22nd Annual International Conference on Mobile Computing and Networking, pp. 1-3 (2016).

* cited by examiner

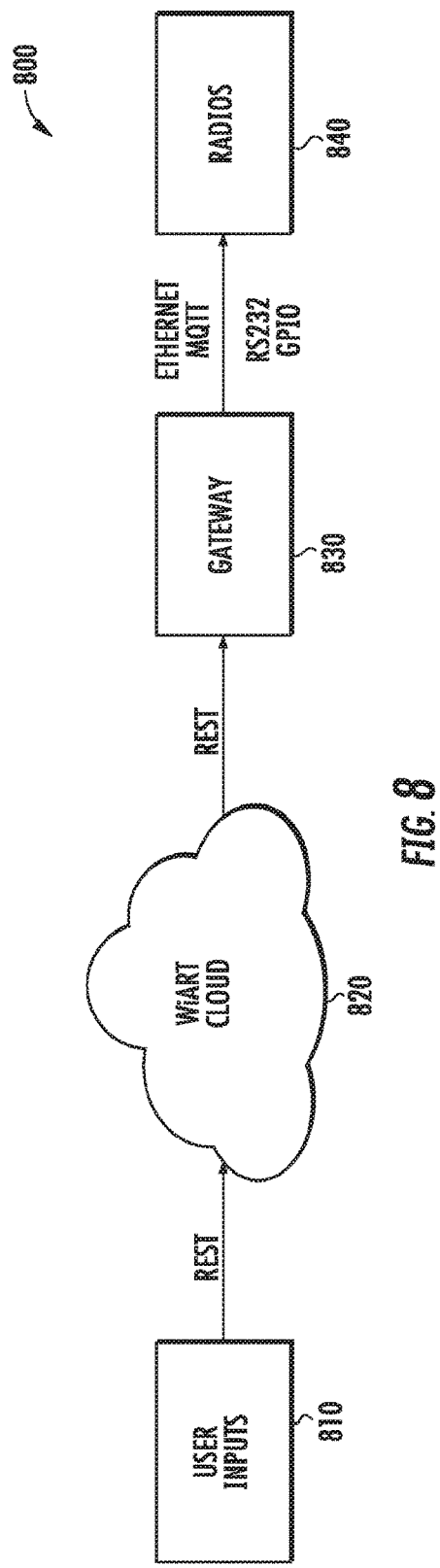

BEAM VISUALIZATION AND USING AUGMENTED REALITY FOR CONTROL AND INTERACTION

STATEMENT REGARDING GOVERNMENT SUPPORT

This invention was made with government support under Contract No. DUE-1241631 awarded by the National Science Foundation. The government has certain rights in the invention.

BACKGROUND

Augmented Reality (AR) is a subset of Mixed Reality (MR) that enables seamless integration of real-world environment and computer-generated objects in real time. AR may be used in many applications to visualize invisible data, signals, and patters and allow for a user to control the same.

Recent advances in hardware and software for mobile computing have boosted the ubiquity of AR and brought about many emerging applications, not limited to only vision but also encompassing all other senses such as touch and hearing. However, AR has not found many applications in the context of wireless connectivity, mainly due to the difficulty of sensing and observing high-speed wireless signals in real time. AR may be employed to visualize signals emanating from wireless routers and distant cell towers, albeit using historical data and not updating live.

Wireless research may be hindered by the fact that radio frequency (RF) electromagnetic signals are invisible and therefore hard to visualize. Without a physically intuitive way to visualize signals as they propagate, wireless transmissions often go unaccounted for, and an "observer" must rely on mathematical analyses or after-the-fact observations to gain a better understanding of wireless network dynamics. There is a need for dynamic visualization of antennas' radiation patterns and beam directions in real time. Such insights may be particularly helpful in algorithmic verification and interpretation of experimental results, especially in mobility-based experiments.

The radiation pattern of an antenna is traditionally measured in an anechoic chamber through an extensive process using highly specialized equipment. Alternatively, simulated three-dimensional polar plots of antenna gains can be generated in domain-specific software such as HFSS from Ansys. While these plots offer a level of visualization of antenna performance, they exist solely in software and are not linked to the radio platforms on which antennas operate. To make matters worse, reconfigurable antennas can assume a number of different radiation patterns, selectable on the fly by the underlying cognitive radio. As a result, in cognitive radio networks enabled by reconfigurable antennas, there exists a disconnect between the available radiation patterns and their effects on network performance.

SUMMARY OF THE EMBODIMENTS

Presenting a visualization of antenna radiation patterns may include sending a request to a server for up-to-date information regarding an antenna mode; receiving the request at the server and reading a register value for the antenna mode; responding, by the server, with updated antenna mode information; and overlaying antenna radiation patterns on an image based on the mode information.

BRIEF DESCRIPTION OF THE DRAWINGS

FIG. 8 shows an example WiART remote radio configuration flow.

DETAILED DESCRIPTION OF THE EMBODIMENTS

Introduction

Augmented Reality (AR) Radiation Pattern Visualization

A 2D/3D graphics development tool such as Unity may be used to target multiple smartphone platforms. The developed application (app) may use the camera of the target device (i.e. smartphone), which in turn seeks for a pattern pre-defined in the app. Upon detection of the pattern, the application overlays an image (i.e. a graphical representation of antenna radiation patterns) on the user's screen. For omnidirectional antennas, the pattern orientation may not be relevant, however, when visualizing directional antennas, the pattern orientation would need to be more critical.

The application may support multiple patterns at once, which can be used to visualize multiple wireless nodes' antenna radiation patterns.

Figure 1:
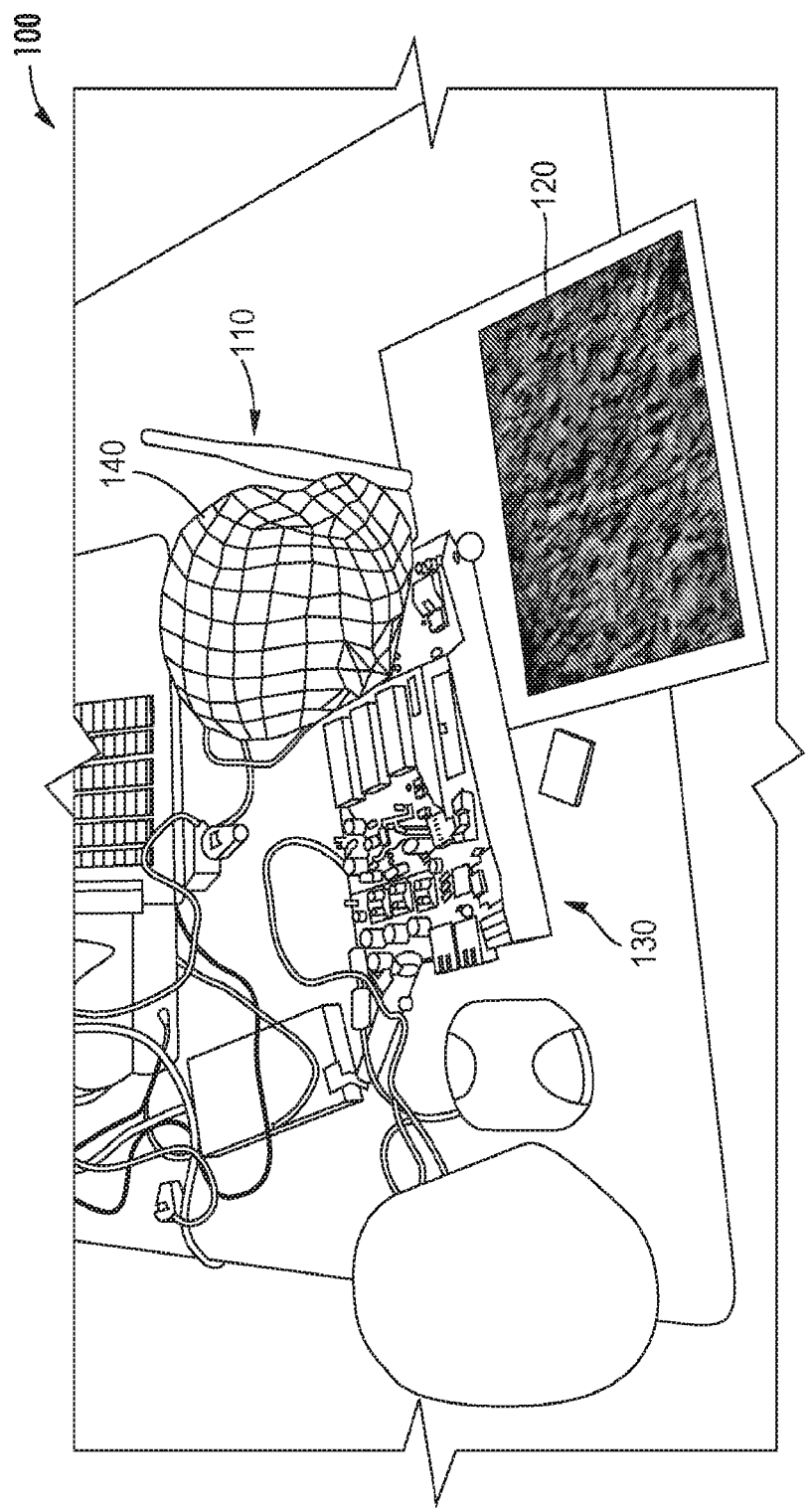
FIGS. 1 and 2 show augmented reality image portrayed on a screen.
Figure 2:
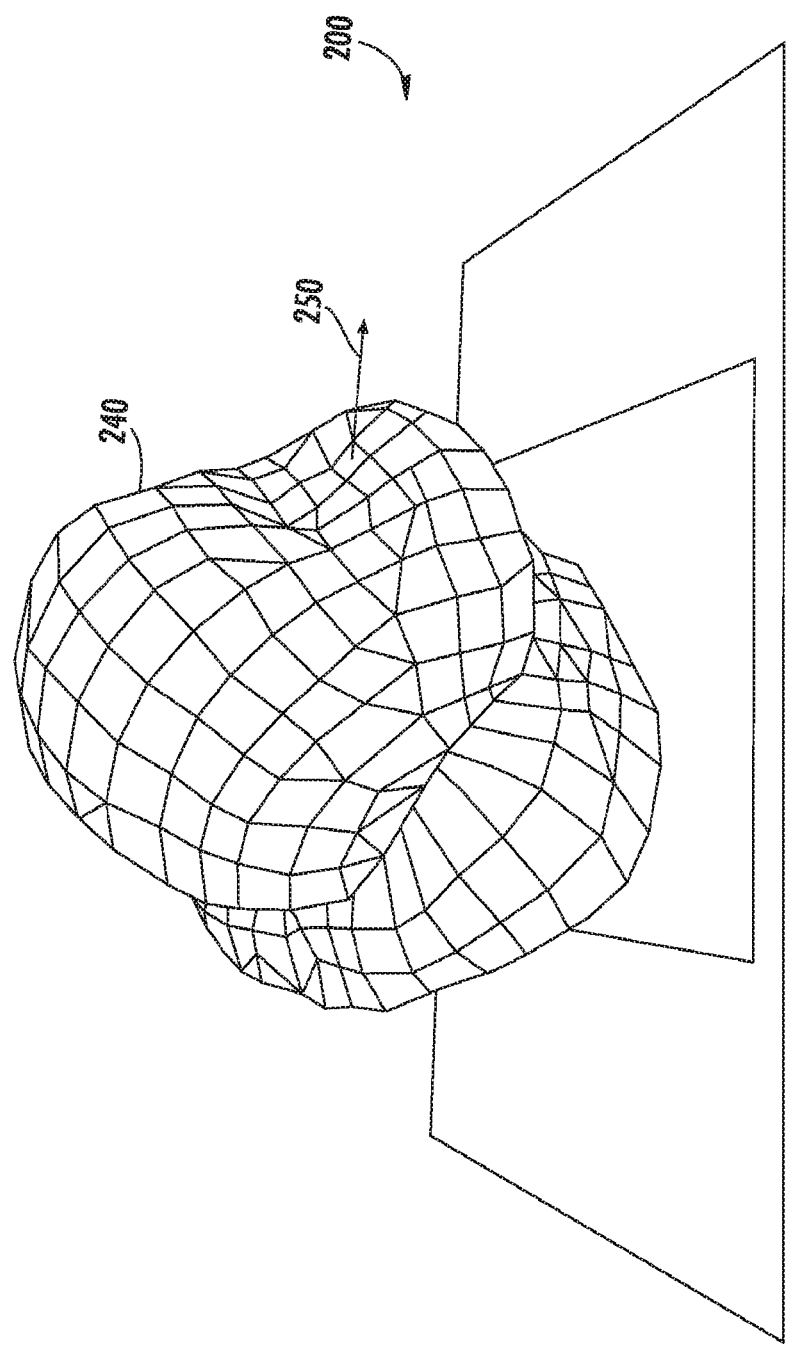

FIG. 1 shows augmented reality image 100 portrayed on a screen. In the image 100, the antenna 110, image pattern 120, and modem 130 (as shown) comprise visual data that is observable to the naked eye. Using an augmented reality interface and framework described herein, an omnidirectional radiation pattern 140 is projected onto the image so a viewer can also see the invisible-to-the-naked-eye antenna radiation pattern. FIG. 2 shows a similar image 200 with a directional radiation pattern 240 with a direction indicated by an arrow 250.

It should be appreciated that the purpose of the image pattern 120 is to act as a set point for the phone camera to orient images from.

Communication Between AR Application and a Wireless Node

The application may visualize radiation patterns from reconfigurable antennas. Reconfigurable antennas are able to modify their radiation patterns based on user selection. A web client-server based communication protocol between the AR app and the wireless node (the wireless node may a software-defined radio (SDR), such as WARP v3 may determine the antenna mode selected. This selection was made based on the ease of development using an open-source system, however, the same protocol can be used in other wireless nodes, such as commercial wireless network cards found in wireless routers. In order to create this protocol, the application initializes a web server on the wireless node as an additional service. On the opposite end of the communication link, the AR app initiates a web client that polls the web server periodically. Upon reception of the client request, the server reads the current antenna mode (from hardware registers) selected and responds with the corresponding setting. The AR app receives the server response and updates the radiation pattern that is being shown to the user accordingly.

Figure 3:
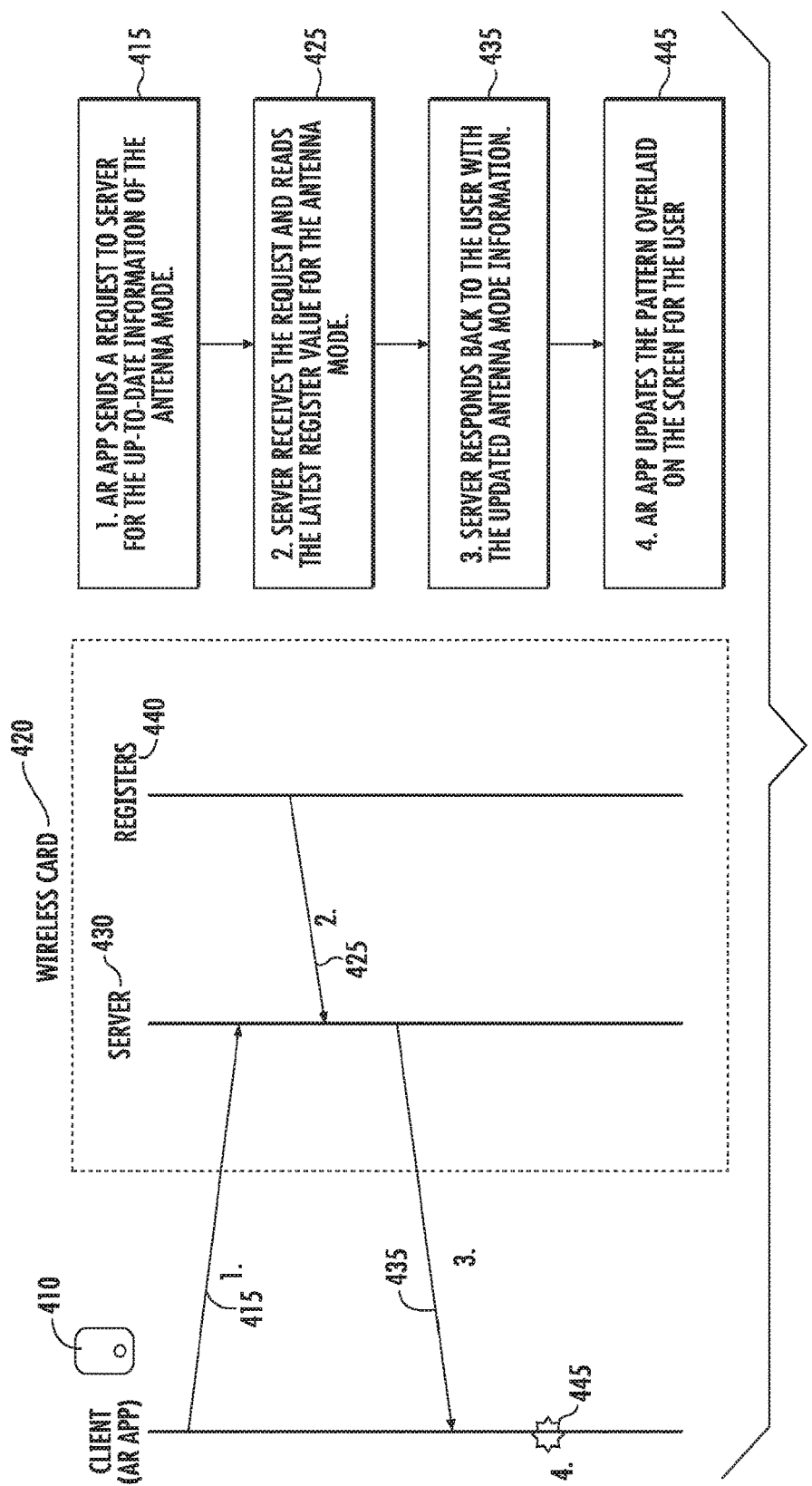
FIG. 3 shows communication between the AR app and wireless node.

FIG. 3 summarizes the signal flow between a client 410 and wireless node 420. First, the AR app at the client mobile phone 410, for example, sends a request 415 to a wireless node server 430 for updated information on the antenna mode. Registers 440 that contain the antenna mode information may be updated independent of the server by the wireless card, receive the request 415 and send a response 425 after reading the latest register value in the antenna mode. This update may take place based on the specific MAC protocol that is running on the node. The server 430 receives this information and transmits the antenna mode information 435 to the client 410, at which point the application upon receiving the antenna mode information, overlays the mode on the user's screen 445. The data may be extracted through antenna simulation and characterization and this may be used to project on the mobile screen.

Figure 4B:
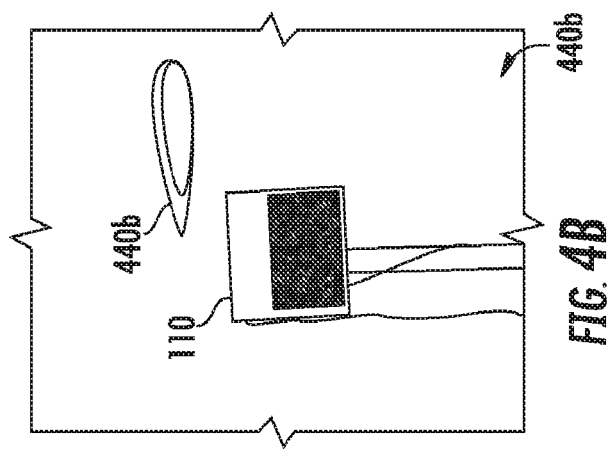
FIGS. 4A-4C show different antenna radiation patterns based on antenna modes.
Figure 4C:
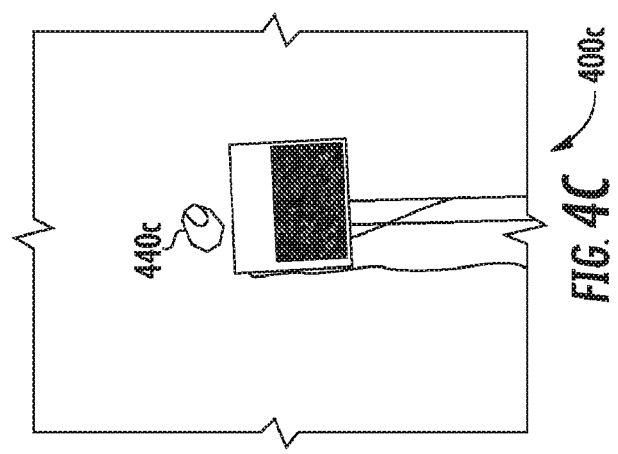
Figure 4A:
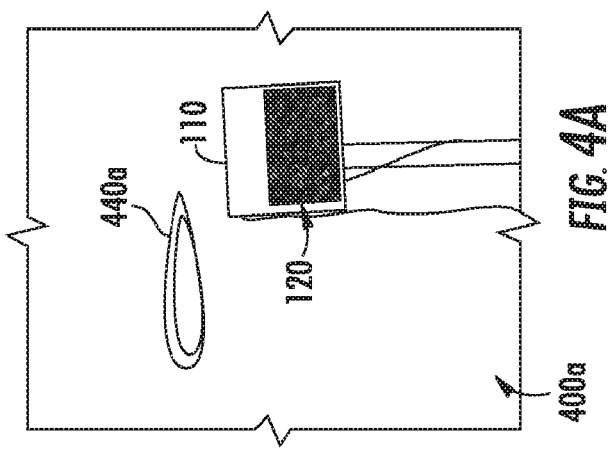

FIGS. 4A-4C show different antenna radiation patterns 440a, 440b, 440c overlaid on image patterns 120 within AR images 400a, 400b, and 400c that show 3 different antenna modes.

Applications of the App and Variations

Beyond visualization, there may be many applications and variations of the app.

(1) Custom image patterns. The physical appearance of radio-enabled objects (wireless routers, laptops, and so on) can be used in place of the image marker to be detected by the app. These objects' appearances may replace the need for image patterns printed on a piece of paper for detection. They may enable to the app to be a standalone solution that works as soon as one downloads it without any additional step needed. Instead of having to produce specialized image markers and associate them with the objects to be annotated with AR, users can simply register the objects themselves to be used for detection and augmentation. The use of real objects as patterns also allows for correct orientation of directional antennas with ease.

Figure 5:
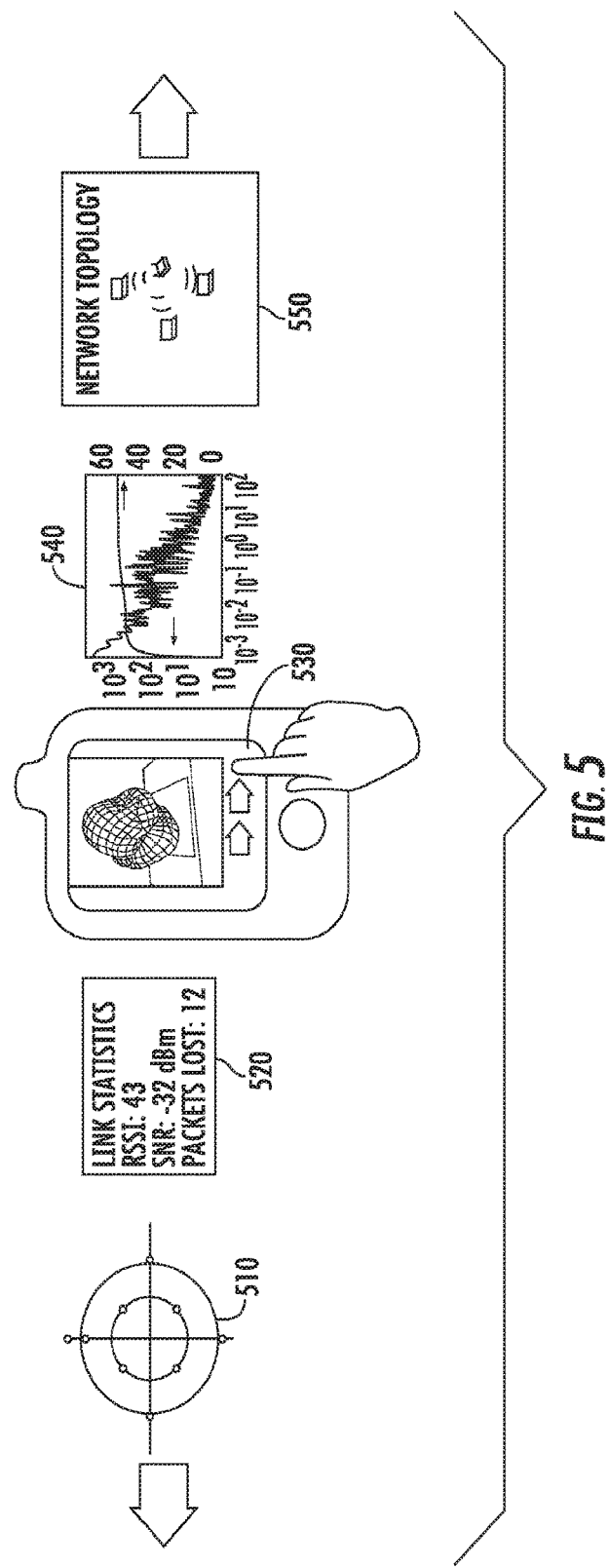
FIG. 5 shows the concept of moving between data sharing images.

(2) Streaming communications. In one application, if two wireless nodes are streaming a video between them, the app may also display signal-to-noise ratio (SNR), constellation diagrams based on modulation scheme used, packet reception rate, bit-error rate (BER), compression ratio and similar data overlaid on a user's screen. This collection of information may be collected by using the server-client protocol described above with reference to FIG. 3. The server may be enhanced to be able to read the additional data points. The user may be able to select between which information to see on the screen by swiping left or right. FIG. 5 shows this concept of moving between data sharing images from received signal constellation 510, link-layer statistics 520, beam viewing 530, received signal strength 540, and network topology 550 for example.

(3) Reconfigurable antennas under noise interference. The nodes may use the antenna mode that maximizes their data throughput, which can be viewed on screen. The application may display the state the antennas are in (directional or omnidirectional). The identification of antennas may be done via visual markers or identifiers. Depending on the marker, the system accesses the internal state of different radios.

(4) Encryption keys generated in real-time as two nodes communicate. The application may display how nodes use physical layer key generation techniques to generate a common encryption key at both ends of the communication link without sharing that key over the air. The app may show how the communication can be intercepted by an eavesdropper if no keys are used, and illustrates the establishment of a secure connection through the use of a visual representation of "shields" around the corresponding radios.

(5) Adaptive communication in a Wi-Fi channel between two radios. A third radio will be set up to turn on and off at times to generate downlink and uplink interference in the channel, thereby forcing the cognitive radios to adapt their antenna patterns to improve link throughputs. The audience can use push buttons on the WARP radios to switch antennas between the forced omnidirectional mode and dynamic, radio-controlled, directional mode with four possible beams. Link throughputs may be plotted on a monitor screen at all times to observe the effects of different antenna radiation patterns. The beam viewer mobile app is pre-installed on several mobile devices and set up to display real-time antenna patterns from each radio node. The audience can therefore instantly observe when the antenna patterns change.

(6) Detect adversarial activities. In addition to collecting radio statistics from wireless devices in a certain area, the application backend may also aggregate these statistics and perform anomaly detection to detect any adversarial activity. A variety of detection techniques may be applied to form a defense barrier for the wireless network. Some of the anomaly detection schemes consist of analyzing packet inter-arrival times, buffer lengths, and wireless characteristics. Real-time alerts and defense policies can also be integrated into the frontend AR application, such as displaying a notification/image and also offering a set of defense options for the frontend user to choose from (e.g. deauthenticate a specific user, switch to a different wireless channel).

(7) Conduct interactive spectrum games. The AR framework may be used to enable users to have fine grained control over their wireless operations. After onboarding their wireless devices with this framework, users may visualize and control wireless activities in real time. The AR frontend application makes available numerous control knobs for users to adjust their wireless settings (e.g., channel channels and transmit powers) and observe immediate outcomes. This controllability can be leveraged to pose the task of optimizing wireless experience as a crowdsourced game, where the cloud backend continuously monitors users' actions and outcomes in a given area to infer the interference and channel conditions in that area. Analysis of this crowdsourced configuration selection game can also enable new control algorithms for wireless network manufacturers.

(8) Systems control. In some settings, a user may be able to use the application to control the invisible world seen in the application. For example, a user may be able to control an invisible airflow through an HVAC system by controlling valves, vents, fans and filters, from within the app, and then visualize the air flow change within the app to achieve a desired outcome. The WiART system of FIGS. 7 and 8 describes this in more detail.

These topics are some examples of applications using the beam viewer application. A modular API may allow others to deploy the system to visualize and control performance in other wireless systems.

System Implementation

Beam Viewing App

Figure 6:
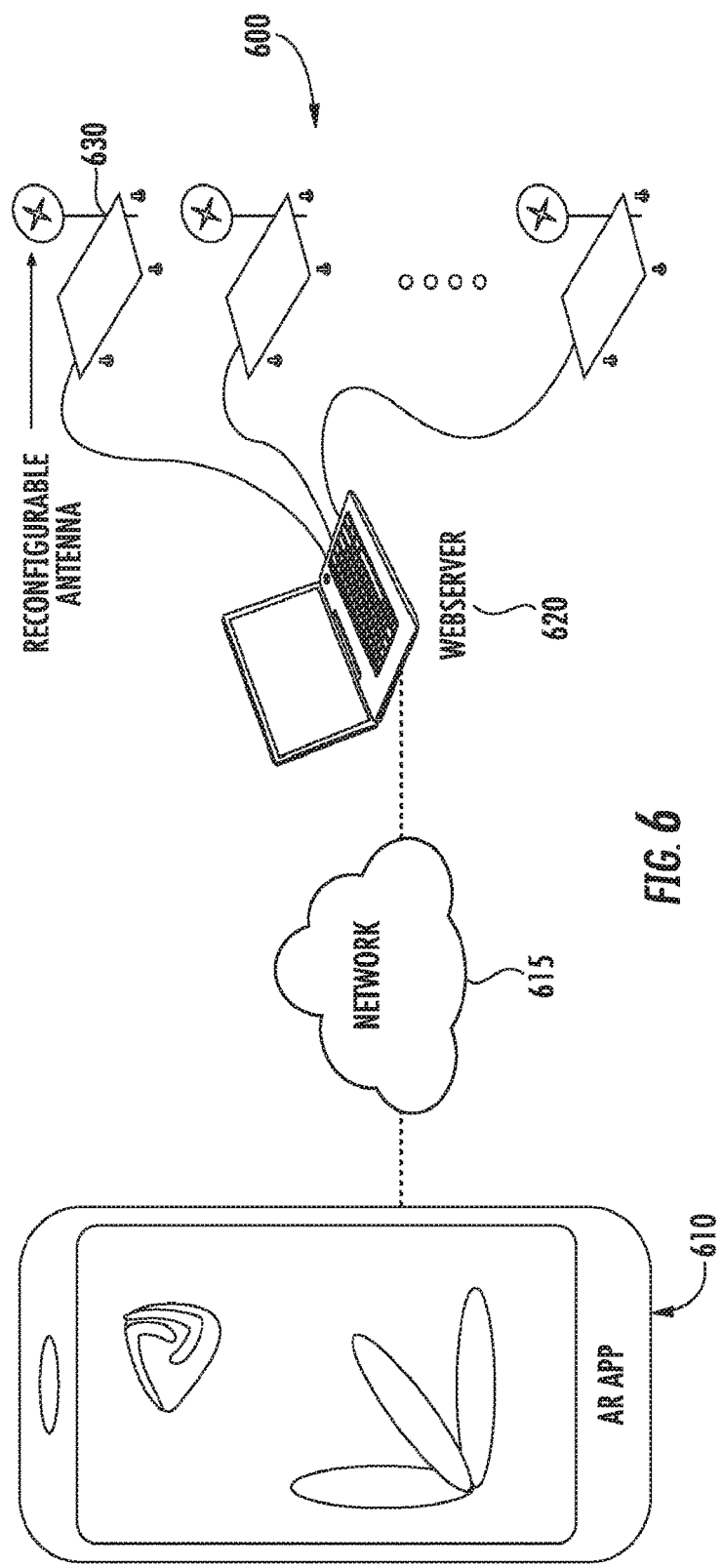
FIG. 6 shows an overview of the application system.

As shown in FIG. 6, the beam viewer application entire system 600 comprises three components: a beam viewer mobile application 610, a cloud server 620 that connects with the beam viewer application 610 via a network 615, and a source (antennas in this example, though other embodiments couple include HVAC, fluid piping/flow, or other invisible applications) 630. The beam viewer mobile application 610 sets the visualization scenarios, the cloud server 620 relays/stores information and the source 630 produces course specific data.

In an antenna visualization, antennas 630 relay information about the antennas' directions to the cloud by the gateway scripts running on nodes. This data may be read by the app 610 so that an appropriate visualization can be integrated with the physical scene being imaged on a smartphone or other camera that portrays the visible scene along with the imaged data. Through an input interface on the smartphone, app users can leverage bi-directional communication between the cloud server 620 and source gateway 630 to both watch the state the antennas are in, or take control over the antennas 630 to have them transmit in different directions.

The Beam Viewer Application Mobile Frontend

A beam viewer application may be an Augmented Reality (AR) multi-platform mobile phone application for dynamic visualization of reconfigurable antennas' radiation patterns. As discussed, the beam viewer application may collect real-time statistics on antenna configurations and link throughputs from an underlying cognitive radio network and depicts them visually on mobile devices. The beam viewer application's real-time visualization system may include a combination of mobile computer vision, interactive game play, and/or a web framework. While the underlying cognitive radio network is not necessary for the beam viewer application to function, the radios may be what actually control the antennas and supply useful real-time information on selected antenna patterns and achieved network throughputs. Without the antenna state selection logic from the cognitive radios, the beam viewer application may display static antenna radiation patterns.

The beam viewer application's frontend may use Qualcomm's Vuforia mobile AR toolkit and the Unity game engine. The AR toolkit is responsible for the framework's integration with the real world, while Unity may control the dynamics of virtual objects including the antenna patterns. The beam viewer mobile application may be set up as a Unity game scene. The scene dynamics happen entirely inside the game engine and are displayed to a mobile screen through the viewpoint of a camera object, which allows integration between the visible and invisible worlds. Besides cameras, a scene can also contain game objects, such as characters or terrains, and light objects, which control and cast light onto the scene. A special ARCamera object, available through the Vuforia plugin for Unity, enables the use of devices' cameras as viewpoints into the game scene and effectively blend the real and virtual worlds. The ARCamera game object is a Unity primitive that regulates what will be displayed on the mobile screen. In this case, image feeds from the device's camera will be captured, processed for detection and augmentation through the ARCamera object, and then displayed to users.

Reconfigurable antennas may be detected spatially through physical image markers (image patterns such as image pattern 120 in FIG. 1) placed directly below them. The image markers are necessary for the AR function to operate, as they act as anchors to establish the one-to-one mapping between spatial locations in the real world and the virtual world that exists solely in the game. These markers correspond to game objects with clearly defined positions in the Unity scene. Vuforia's APIs may be leveraged to perform object recognition. Once the antennas are detected by the Unity engine, pre-existing 3D radiation pattern objects may be added at relative offsets to the image markers and dynamically controlled through game action scripts. The 3D antenna pattern objects may be previously extracted from HFSS after measurements and imported into Unity as game objects. At this point the beam viewer application's web backend may be engaged to transform the radiation patterns based on real-time inputs from the predominant cognitive radio link. The update frequency may be configurable and currently set at 10 times per second.

The Beam Viewer Application Backend

The beam viewer application's backend includes actual cognitive radio nodes that control the reconfigurable antennas, as well as a central webserver to collect and serve real-time antenna pattern information and network metrics. The system may use a planar Reconfigurable Alford Loop Antenna with integrated control circuitry. A directionality-based cognitive network on the Wireless open-Access Research Platform (WARP) may control the antennas.

This implementation leverages WARP's real-time 802.11 physical layer and a custom TDMA-style MAC with machine learning logic for selecting favorable antenna states to boost link performance. The central webserver, which may be implemented in Python, communicates with the radio nodes via serial COM ports to collect latest antenna and throughput data. Specific information for each network node can then be served through dedicated web URLs. The beam viewer application's frontend may continuously poll these URLs to capture and update the network-wide antenna configurations.

The webserver/cloud backend is used for aggregating radio statistics and storing them in a database for later retrieval by the mobile application. One implementation may use Parse Server—an open source mobile backend implementation. Parse Server contains a full-fledged webserver and other process management services implemented in Javascript. For database storage, an implementation may useMongoDB, which is integrated with Parse Server.

Interaction with Wireless Network using Augmented Reality

With the dense deployment, increasing programmability, and fast-paced dynamics of modern wireless systems, it has become more difficult to gain timely insights into wireless network operations. Without a physically intuitive way to visualize and interact with network activities and wireless signals as they propagate through the medium, wireless transmissions often go unaccounted for, and users resort to trace analysis or after-the-fact examinations to gain a better understanding of wireless network dynamics. The system herein is a Wireless Augmented Reality Toolkit (WiART), a comprehensive mobile augmented reality framework to both visualize and interact with wireless devices and networks in a real-time manner. An illustration of the concept is shown in FIG. 7, depicting what users would see on their mobile devices' screens when using the WiART mobile application to control their network devices.

Figure 7:
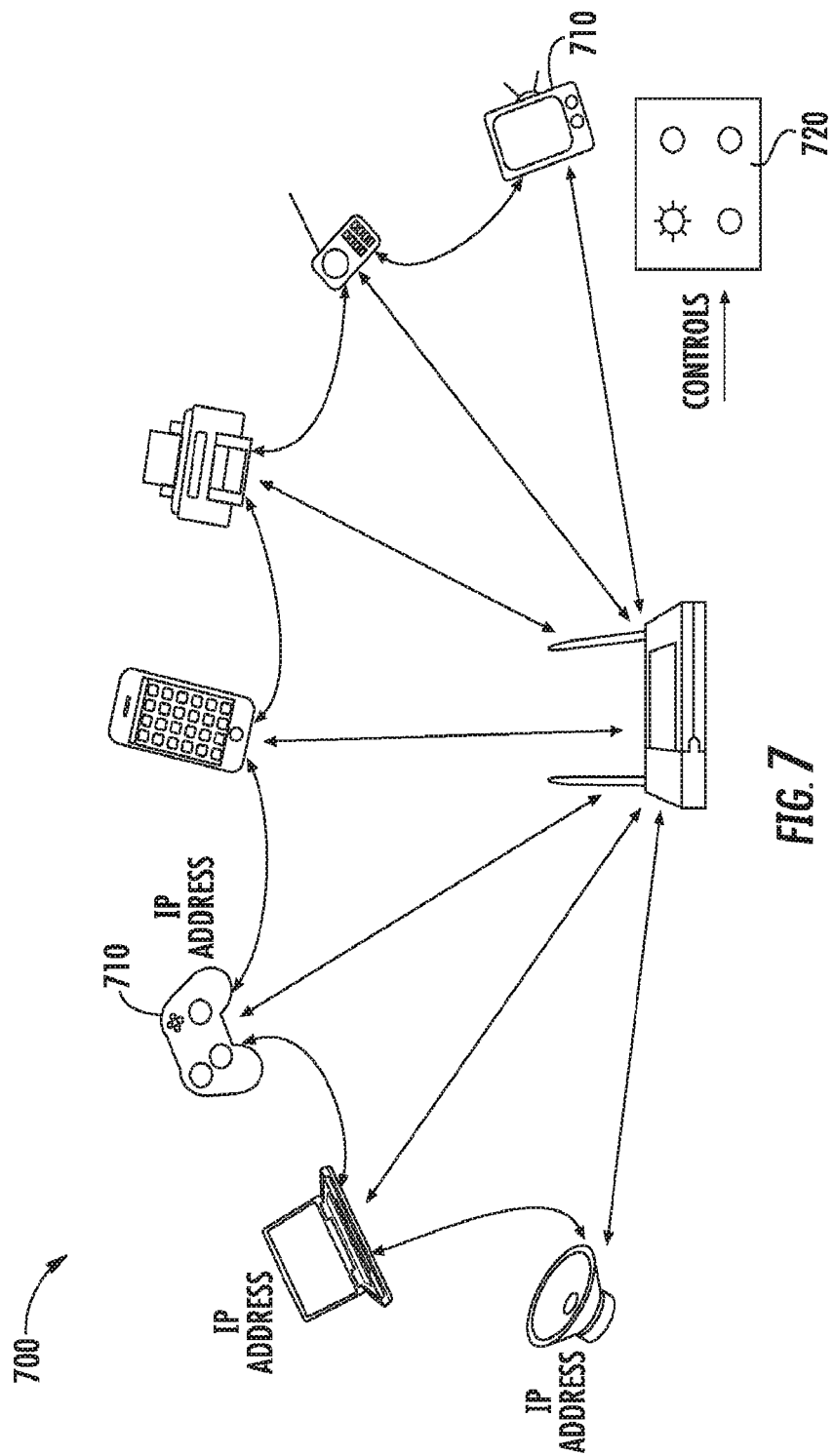
FIG. 7 shows several devices controlled by a controller in a concept depiction of the system.

FIG. 7 shows several devices 710 controlled by a controller 720 in a concept depiction of the WiART system 700. The system 700 may provide a new interface based on smart phone augmented reality for the visualization and control of wireless networks. The system 900 may allow for "gamification" of the configuration of wireless networking parameters (e.g., antenna characteristics, operating frequency, modulation and coding parameters, networking parameters) that allows users to rapidly receive graphical feedback on the effectiveness of the configuration choices they make. Furthermore, by feeding back the results of this game to a central server in the cloud and analyzing the collected data, new control algorithms for wireless networking hardware may be developed based on crowdsourcing.

A wireless augmented reality toolkit (WiART) may include four components:

A wireless network analytic platform: The network analytic platform of WiART may serve a dual purpose. First, it may collect and aggregate wireless measurement data from all network devices to help users manage their wireless networks and achieve better performance. This means WiART may reveal to users hard-to-uncover facts about their wireless deployment, such as the number of nearby access points (APs) on the same Wi-Fi channel, or the specific locations of dead spots in their service area. Secondly, by increasing users' incentive to use the service through useful personal analytics and user interfaces, WiART can at the same time collect geolocation-specific wireless measurement data that can be mined to aid in the process of network maintenance and deployment.

WiART may build an understanding of the wireless channel conditions and wireless network activities in an operating area (i.e. a user's home or enterprise office) by interacting directly with network devices. WiART collects radio analytics within a wireless networks analytics platform from commercial off-the-shelf (COTS) network devices, such as Wi-Fi routers, laptops, and mobile devices. This functionality requires support from the devices' firmware to report current measured network statistics to the WiART data aggregation and analytic cloud backend. Currently deployed network devices may gain this capability through a routine firmware update. The collected link/network metrics may include, for example, location-specific received signal strength indicator (RSSI) from all network devices, estimated packet loss rate through overheard packet transmissions without acknowledgments, total number as well as identities of connected devices. Network metrics collected by individual COTS wireless devices may then be relayed and aggregated periodically in the WiART cloud backend to draw trends and analytics that are of interest to end users, as well as leverage crowdsourcing techniques to develop new control algorithms for networks based on the results of the "gamified" configuration process.

In addition to COTS devices, WiART may also support the use of optional special purpose RF sensors as an additional method to measure wireless network conditions, especially when WiART cannot get inputs directly from COTS network devices due to privacy reasons. These RF sensors may be low-cost, small form-factor, Wi-Fi-enabled embedded devices (e.g., Raspberry Pi's and Arduinos boards) that can measure and extrapolate a wide range of wireless network metrics in real time. The sensors may be deployed by WiART's end users to gain a better understanding of their wireless network operations.

A user interface (UI) that uses augmented reality to present aggregated radio analytics to users in an intuitive and easy-to-understand manner, leveraging a digital imagery overlay of the real world. Augmented reality (AR) is a subset of Mixed Reality (MR) that enables seamless integration of the real-world environment and computer-generated objects in real time. Specifically, the AR component of WiART blends visual information from the real world (e.g., device locations and mobility, obstructions, and scattering elements) with generated radio analytics presented as graphical primitives in the virtual realm. This integration allows for a deeper and more timely understanding of wireless activities without resorting to the traditional network management user interface, such as terminal consoles or web frontends. It may also allow for the gamification of wireless network parameter selection.

A control interface and an associated control flow that may also use augmented reality to enable remote control of Internet-connected network devices (routers, thermostats, etc.) directly from users' mobile devices. The control interface may comprise virtual control knobs in the form of 2D/3D graphical UI elements overlaid on top of network devices as users point their mobile devices' camera toward them. User inputs to control wireless networking activities, such as transmit powers, antenna radiation patterns, desired Wi-Fi quality-of-service (QoS) traffic classes, and wireless network routes, may all be registered with the WiART backend cloud by displaying the appropriate virtual control knobs sending user inputs to the cloud. The user controls may then be carried out on the corresponding network devices through the associated control flow.

This control flow may implement a web framework to enable the WiART backend cloud to interacts directly with Internet-enabled network devices via web requests (e.g., REST APIs). For non-Internet-enabled devices, such as wireless sensors and radios with limited processing capabilities, an Internet-of-Things (IoT) gateway may be used as a middle man. The gateway may relay web requests from the WiART cloud to network devices using more lightweight messaging protocols, such as Ethernet, MQTT, RS232, and GPIO. FIG. 8 shows an example WiART remote radio configuration flow 800 that includes user inputs 810 from a user/device, a WiART cloud 820 through which the user inputs travel to the gateway 830, and radios 840 that interact with the gateway 830. The execution of user commands is entirely up to the individual network devices, which can determine how much of their internal operations can be controlled by the end users. At a minimum, the set of control knobs that a network device typically may provide to the traditional web management interface may be supported when control requests are relayed through the WiART framework.

A cloud management framework that is used to place network devices securely under the management of WiART framework may allow them to be recognized by the AR mobile application. WiART's AR frontend may recognize devices in the real world through the mobile device' camera feed and associated 2D image markers. This management framework allows users to generate new markers and associate them with onboarding network devices through a user-friendly configuration process. An example onboarding process may be:

i. logging a user log in to their WiART account and select/generate a new marker;

ii. the device contacts the WiART cloud with an onboarding request containing the user's WiART credentials (obtained previously through communications with the mobile app)

iii. the user selects the available analytics to be shown in the AR mobile app, determined based on the network device's reporting capabilities.

iv. giving the user the option to play a game to adjust control knobs to optimize some aspect of wireless network in consideration. Analysis of this crowdsourced configuration selection game could also enable new control algorithms for wireless network manufacturers. The main incentive for users to play this selection game is their desire to optimize wireless coverage and performance, and they may engage in this selection process at least once a week to continuously tune their wireless experience. Using users' game inputs and observable outcomes, the backend can perform data aggregation and analysis from multiple users over time in a given area to build its understanding of wireless conditions, trends, and interference patterns in that area.

After the onboarding process, the WiART management framework may internally associate the selected marker with the new network device and place it under cloud controls. The user can then print a physical marker and place it on the network device. When the AR mobile app detects this image marker, it may augment the camera view with wireless statistics and control knobs specifically for that network device.

While the invention has been described with reference to the embodiments above, a person of ordinary skill in the art would understand that various changes or modifications may be made thereto without departing from the scope of the claims.

The invention claimed is:

1. A method of presenting a visualization of antenna radiation patterns comprising:
   sending a request to a server for information regarding an antenna mode;
   receiving the request at the server and reading data regarding the antenna mode; responding, by the server, with the data corresponding to updated antenna mode information; and
   overlaying a graphical representation of antenna radiation patterns, based on the antenna mode information, on an image.

2. The method of claim 1, further comprising displaying the image, wherein the image is a view through a camera.

3. The method of claim 1, wherein the sending, receiving, responding, and overlaying are done multiple times such that the overlaying a graphical representation of the antenna radiation patters is periodically updated.

4. The method of claim 1, further comprising displaying signal to noise ratio.

5. The method of claim 1, further comprising displaying constellation diagrams based on modulation scheme used.

6. The method of claim 1, further comprising displaying packet reception rate.

7. The method of claim 1, further comprising displaying bit-error rate.

8. The method of claim 1, further comprising displaying compression ratio.

9. A system for using augmented reality to visualize and interact with wireless network activities comprising:
   a device that displays a graphical representation of antenna radiation patterns on an image, based on antenna mode information;
   an augmented reality interface that presents virtual control knobs on the image that allow for control of the antenna radiation patterns; and
   a wireless networks analytics platform that collects and aggregates wireless data from network devices and transmits the data to the device such that the augmented reality interface can control the network devices.

10. The system of claim 9, wherein the wireless network analytics platform collects and stores data about the network devices.

11. The system of claim 10, further comprising a cloud management framework that manages device association with the augmented reality interface and aggregates wireless network device information to develop new network device control algorithms.

12. The system of claim 11, wherein the cloud management interface onboards network devices by following at least the following: logging a user log in to their account and select / generate a new marker; contacting the cloud management framework with an onboarding request containing a user's credentials; selecting available analytics to be shown in the augmented reality interface; and giving the user an option to play a game to adjust control knobs to optimize some aspect of wireless network in consideration.

13. The system of claim 9, further comprising a control interface that enables remote control of Internet-connected network devices.

14. The system of claim 9, wherein the augmented reality interface is further comprised in a user interface that blends a visual image visible to a naked eye and invisible antenna radiation pattern.

15. A system for using augmented reality to visualize and interact with wireless network activities, comprising:
   a wireless network analytic platform;
   an augmented reality interface to present radio analytics to users;
   an augmented reality interface that presents virtual control knobs to users and enable gamification of wireless network control; and
   a cloud management framework that securely manages device association with the augmented reality framework and aggregates crowdsourced wireless network parameter selection to develop new control algorithms.

16. The system of claim 15, further comprising a wireless networks analytics platform that collects and aggregates wireless data from network devices and transmits the data to the device such that the augmented reality interface can control the network devices.

17. The system of claim 15, wherein the wireless network analytics platform collects and stores data about the network devices.

18. The system of claim 15, further comprising a control interface that enables remote control of Internet-connected network devices.

19. The system of claim 18, further comprising a cloud management framework that manages device association with the augmented reality interface and aggregates wireless network device information to develop new network device control algorithms.

* * * * *